United States Patent
Tapily

(10) Patent No.: US 10,049,913 B2
(45) Date of Patent: Aug. 14, 2018

(54) METHODS FOR $SiO_2$ FILLING OF FINE RECESSED FEATURES AND SELECTIVE $SiO_2$ DEPOSITION ON CATALYTIC SURFACES

(71) Applicant: Tokyo Electron Limited, Minato-ku, Tokyo (JP)

(72) Inventor: Kandabara N. Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/484,972

(22) Filed: Apr. 11, 2017

(65) Prior Publication Data
US 2017/0294339 A1    Oct. 12, 2017

Related U.S. Application Data

(60) Provisional application No. 62/425,563, filed on Nov. 22, 2016, provisional application No. 62/338,189, filed on May 18, 2016, provisional application No. 62/321,662, filed on Apr. 12, 2016.

(51) Int. Cl.
*H01L 21/76* (2006.01)
*H01L 21/762* (2006.01)
*H01L 21/02* (2006.01)

(52) U.S. Cl.
CPC .... *H01L 21/76229* (2013.01); *H01L 21/0228* (2013.01); *H01L 21/02164* (2013.01); *H01L 21/02178* (2013.01); *H01L 21/02181* (2013.01)

(58) Field of Classification Search
USPC .......................................................... 438/437
See application file for complete search history.

(56) References Cited

U.S. PATENT DOCUMENTS

| 6,867,152 B1 | 3/2005 | Hausmann et al. |
| 7,271,112 B1 | 9/2007 | Papasouliotis et al. |
| 7,294,593 B2 | 11/2007 | Rulkens et al. |
| 7,625,820 B1 | 12/2009 | Papasouliotis et al. |

(Continued)

OTHER PUBLICATIONS

B.B. Burton et al. "Rapid SiO2 Atomic Layer Deposition Using Tris(tert-pentoxy)silanol", Chem Mater. 2008, 20, 7031-7043.

*Primary Examiner* — Timor Karimy

(57) ABSTRACT

Methods for void-free $SiO_2$ filling of fine recessed features and selective $SiO_2$ deposition on catalytic surfaces are described. According to one embodiment, the method includes providing a substrate containing recessed features, coating surfaces of the recessed features with a metal-containing catalyst layer, in the absence of any oxidizing and hydrolyzing agent, exposing the substrate at a substrate temperature of approximately 150° C. or less, to a process gas containing a silanol gas to deposit a conformal $SiO_2$ film in the recessed features, and repeating the coating and exposing at least once to increase the thickness of the conformal $SiO_2$ film until the recessed features are filled with $SiO_2$ material that is void-free and seamless in the recessed features. In one example, the recessed features filled with $SiO_2$ material form shallow trench isolation (STI) structures in a semiconductor device.

20 Claims, 12 Drawing Sheets

(56) References Cited

U.S. PATENT DOCUMENTS

| | | |
|---|---|---|
| 8,158,488 B2 | 4/2012 | Hill et al. |
| 2008/0122012 A1* | 5/2008 | Fukuhara .......... H01L 21/28273 257/397 |
| 2010/0173074 A1* | 7/2010 | Juarez ............... C23C 16/45523 427/255.28 |
| 2017/0092533 A1 | 3/2017 | Chakraborty et al. |

* cited by examiner

SiO₂ filling of recessed features. Aspect ratio (AR) = 8

Before SiO₂ filling

After complete SiO₂ filling

Before SiO₂ filling ative features with $SiO_2$ material. The inventors have discovered a processing method that provides void-less and seamfree filling of fine recessed features with $SiO_2$ material. The $SiO_2$ material is deposited at low temperature in the absence of a plasma and has many material properties that are similar to conventional high-temperature $SiO_2$ material. It is therefore well suited for forming STI structures. Furthermore, a processing method is described for selectively depositing a $SiO_2$ film on different materials.

METHODS FOR $SiO_2$ FILLING OF FINE RECESSED FEATURES AND SELECTIVE $SiO_2$ DEPOSITION ON CATALYTIC SURFACES

CROSS-REFERENCE TO RELATED APPLICATIONS

This application is related to and claims priority to U.S. Provisional Patent Application Ser. No. 62/321,662 filed on Apr. 12, 2016, the entire contents of which are herein incorporated by reference. This application is related to and claims priority to U.S. Provisional Patent Application Ser. No. 62/338,189 filed on May 18, 2016, the entire contents of which are herein incorporated by reference. This application is related to and claims priority to U.S. Provisional Patent Application Ser. No. 62/425,563 filed on Nov. 22, 2016, the entire contents of which are herein incorporated by reference.

FIELD OF THE INVENTION

This invention relates to methods for processing a substrate, and more particularly to a method for silicon dioxide ($SiO_2$) filling of fine recessed features on a substrate, for example fine recessed features that form shallow trench isolation (STI) structures, and a method for selectively depositing a $SiO_2$ film on different materials.

BACKGROUND OF THE INVENTION $SiO_2$ is the most common dielectric material in silicon microelectronic devices. However, despite its importance, void-less and seamfree filling of fine recessed features with $SiO_2$ material at low temperatures has proved difficult. Furthermore, new methods for selective deposition of $SiO_2$ films on different materials at low substrate temperatures are needed.

SUMMARY OF THE INVENTION

Methods for void-free $SiO_2$ filling of fine recessed features and selective $SiO_2$ deposition on catalytic surfaces are described. The inventors have discovered a processing method that provides void-less and seamfree filling of fine recessed features with $SiO_2$ material. The $SiO_2$ material is deposited at low temperature in the absence of a plasma and has many material properties that are similar to conventional high-temperature $SiO_2$ material. It is therefore well suited for forming STI structures. Furthermore, a processing method is described for selectively depositing a $SiO_2$ film on different materials.

According to one embodiment, the method includes providing a substrate containing recessed features, coating surfaces of the recessed features with a metal-containing catalyst layer, and in the absence of any oxidizing and hydrolyzing agent, exposing the substrate at a substrate temperature of approximately 150° C. or less, to a process gas containing a silanol gas to deposit a conformal $SiO_2$ film in the recessed features, and repeating the coating and exposing at least once to increase the thickness of the conformal $SiO_2$ film until the recessed features are filled with $SiO_2$ material that is void-free and seamless in the recessed features. In one example, the recessed features filled with $SiO_2$ material may form STI structures in a semiconductor device.

According to another embodiment, the method includes providing a substrate containing a first material containing a first surface and a second material containing a second surface, where the second surface contains a metal-containing catalyst layer, and in the absence of any oxidizing and hydrolyzing agent, exposing the substrate at a substrate temperature of approximately 150° C. or less, to a process gas containing a silanol gas to selectively deposit a $SiO_2$ film on the second surface.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Figure 1:
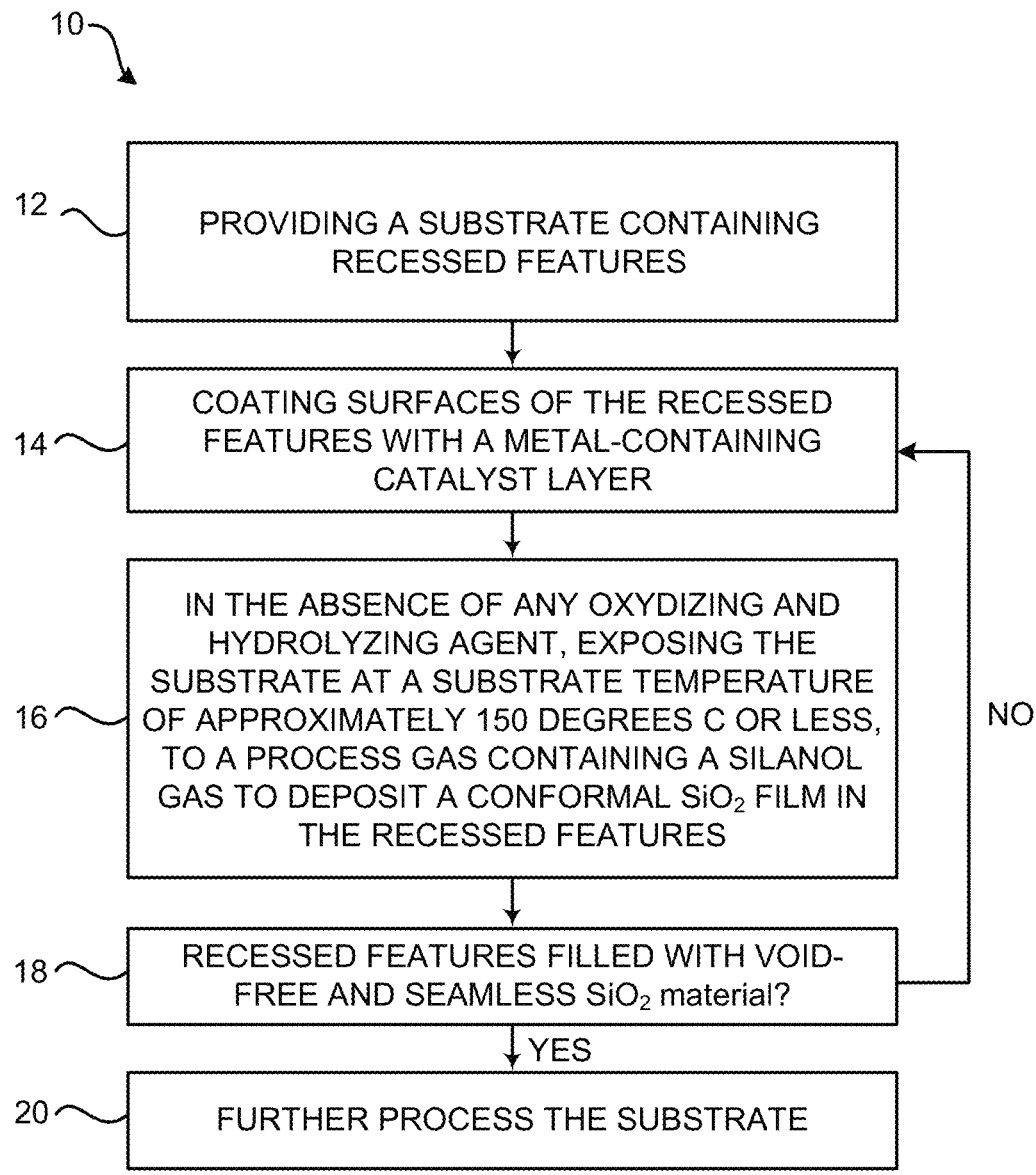
FIG. 1 is a process flow diagram for processing a substrate according to an embodiment of the invention.
Figure 2A:
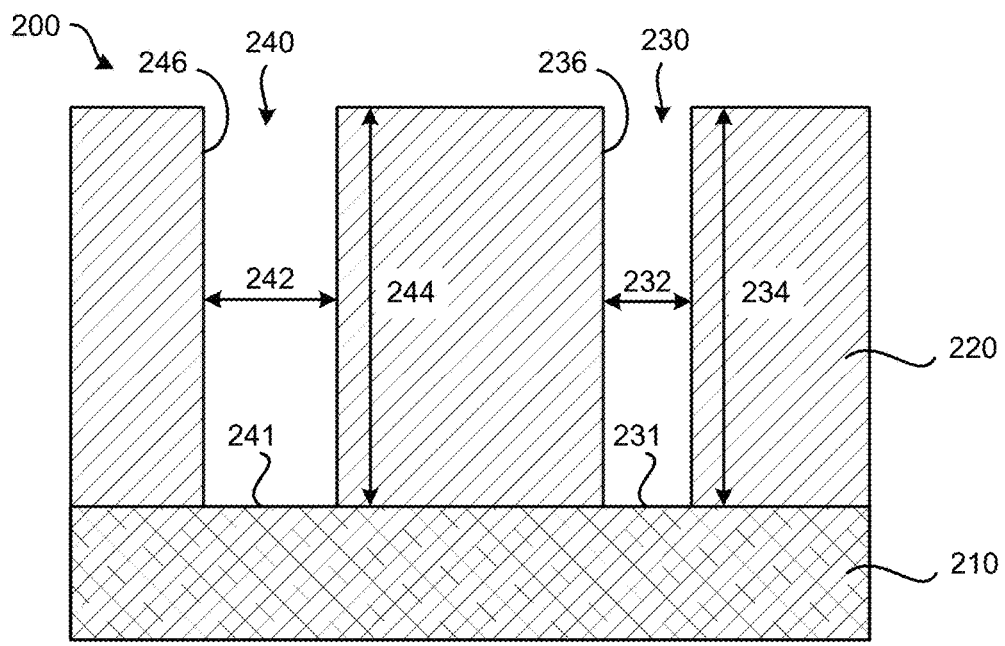
FIGS. 2A-2C schematically show through cross-sectional views a method of processing a substrate according to an embodiment of the invention.
Figure 2B:
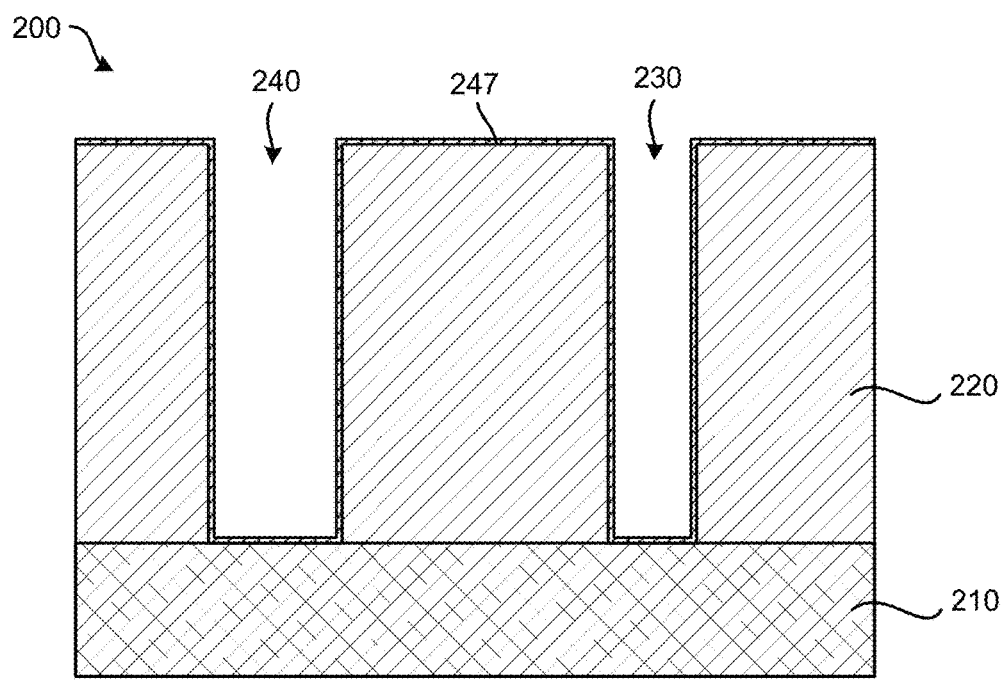
Figure 2C:
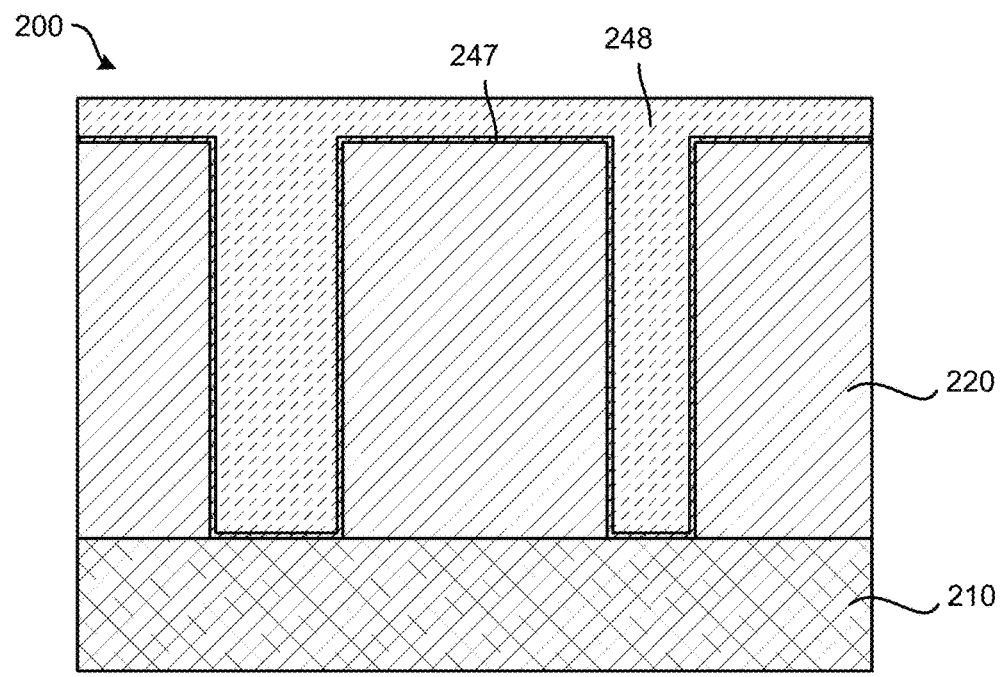

FIG. 1 is a process flow diagram for processing a substrate according to an embodiment of the invention, and FIGS. 2A-2C schematically show through cross-sectional views a method of processing a substrate according to an embodiment of the invention.

Referring now to FIGS. 1 and 2A, a process flow 10 includes, in 12, providing a substrate 200 containing recessed features 230 and 240. The substrate 200 includes a first layer 210 and a second layer 220 on the first layer 210. The second layer 220 has recessed features 230 and 240 extending through the second layer 220. The recessed feature 230 has a sidewall 236 and a bottom 231. The recessed feature 240 has a sidewall 246 and a bottom 241. The recessed features 230, 240 may be formed using well-known lithography and etching processes. As depicted in FIG. 2A, the recessed features 230 and 240 may have different widths. One or both of the recessed features 230, 240 can, for example, have widths 232, 242 that are less than 200 nm, less than 100 nm, less than 50 nm, less than 25 nm, less than 20 nm, or less than 10 nm. In other examples, one or both of the recessed features 230, 240 can have widths 232, 242 that are between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. One or both of the recessed features 230, 240 can, for example, have depths 234, 244 of 25 nm, 50 nm, 100 nm, 200 nm, or greater than 200 nm. In one example, one or more of the recessed features 230, 240 can have a width between about 10 nm and about 50 nm, and a depth between about 100 nm and about 300 nm.

According to one embodiment, the first layer 210 and the second layer 220 may contain the same material. Therefore, the bottoms 231, 241 and the sidewalls 236, 246 may contain the same material. According to another embodiment, the first layer 210 and the second layer 220 may contain different materials. For example, the bottoms 231, 241 and the sidewalls 236, 246 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from the group consisting of $HfO_2$, $ZrO_2$, $TiO_2$, and $Al_2O_3$. For example, the metal and the metal-containing materials may be selected from the group consisting of Cu, Al, Ta, Ru, TaN, TaC, and TaCN.

According to an embodiment of the invention, as illustrated in FIGS. 1 and 2B, the method further includes, in 14, coating surfaces of the substrate 200, including the surfaces of the recessed features 230, 240, with a metal-containing catalyst layer 247.

The technique of conformally coating surfaces of the substrate 200 may include a monolayer deposition ("MLD") method. The MLD method may include, for example, an ALD method, which is based on the principle of the formation of a saturated monolayer of reactive precursor molecules by chemisorption. A typical MLD process for forming an AB film, for example, consists of injecting a first precursor or reactant A ("RA") for a period of time in which a saturated monolayer of A is formed on the substrate. Then, RA is purged from the chamber using an inert gas, Gi. A second precursor or reactant B ("RB") is then injected into the chamber, also for a period of time, to combine B with A and form the layer AB on the substrate. RB is then purged from the chamber. This process of introducing precursors or reactants, purging the reactor, introducing another or the same precursors or reactants, and purging the reactor may be repeated a number of times to achieve an AB film of a desired thickness. The thickness of an AB film deposited in each ALD cycle may range from about 0.5 angstrom to about 2.5 angstrom.

In some embodiments, the MLD process when forming an AB film may include injecting a precursor containing ABC, which is adsorbed on the substrate during the first step, and then removing C during the second step. In accordance with some embodiments of the invention, the metal-containing catalyst layer 247 may comprise metal-containing layer. Examples of metal-containing layers include layers that contain aluminum (Al), titanium (Ti), or both aluminum and titanium. According to one embodiment, the metal-containing layer is selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, and combinations thereof.

Embodiments of the invention may utilize a wide variety of Al-containing precursors. For example, many aluminum precursors have the formula:

$$AlL_1L_2L_3D_x$$

where $L_1$, $L_2$, $L_3$ are individual anionic ligands, and D is a neutral donor ligand where x can be 0, 1, or 2. Each $L_1$, $L_2$, $L_3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Other examples of aluminum precursors include: $AlMe_3$, $AlEt_3$, $AlMe_2H$, $[Al(O^sBu)_3]_4$, $Al(CH_3COCHCOCH_3)_3$, $AlCl_3$, $AlBr_3$, $AlI_3$, $Al(O^iPr)_3$, $[Al(NMe_2)_3]_2$, $Al(^tBu)_2Cl$, $Al(^tBu)_3$, $Al(^tBu)_2H$, $AlEt_2Cl$, $Et_3Al_2(O^sBu)_3$, and $Al(THD)_3$, where Me, Et, Pr, Bu, and THD refer to methyl, ethyl, propyl, butyl, and 2,2,6,6-tetramethyl-3,5-heptanedionate groups, respectively.

Embodiments of the invention may utilize a wide variety of Ti-containing precursors. Examples include Ti-containing precursors having "Ti—N" intra-molecular bonds include $Ti(NEt_2)_4$(TDEAT), $Ti(NMeEt)_4$(TEMAT), $Ti(NMe_2)_4$(TDMAT). Other examples include Ti-containing precursors containing "Ti—C" intra-molecular bonds include $Ti(COCH_3)(\eta5\text{-}C_5H_5)_2Cl$, $Ti(\eta5\text{-}C_5H_5)Cl_2$, $Ti(\eta5\text{-}C_5H_5)Cl_3$, $Ti(\eta5\text{-}C_5H_5)_2Cl_2$, $Ti(\eta5\text{-}C_5(CH_3)_5)Cl_3$, $Ti(CH_3)(\eta5\text{-}C_5H_5)_2Cl$, $Ti(\eta5\text{-}C_9H_7)_2Cl_2$, $Ti((\eta5\text{-}C_5(CH_3)_5)_2Cl$, $Ti((\eta5\text{-}C_5(CH_3)_5)_2Cl_2$, $Ti(\eta5\text{-}C_5H_5)_2(\mu\text{-}Cl)_2$, $Ti(\eta5\text{-}C_5H_5)_2(CO)_2$, $Ti(CH_3)_3(\eta5\text{-}C_5H_5)$, $Ti(CH_3)_2(\eta5\text{-}C_5H_5)_2$, $Ti(CH_3)_4$, $Ti(\eta5\text{-}C_5H_5)(\eta7\text{-}C_7H_7)$, $Ti(\eta5\text{-}C_5H_5)(\eta8\text{-}C_8H_8)$, $Ti(C_5H_5)_2(\eta5\text{-}C_5H_5)_2$, $Ti((C_5H_5)_2)_2(\eta\text{-}H)_2$, $Ti(\eta5\text{-}C_5(CH_3)_5)_2$, $Ti(\eta5\text{-}C_5(CH_3)_5)_2(H)_2$, and $Ti(CH_3)_2(\eta5\text{-}C_5(CH_3)_5)_2$. $TiCl_4$ is an example of a titanium halide precursor containing a "Ti-halogen" bond.

Figure 7:
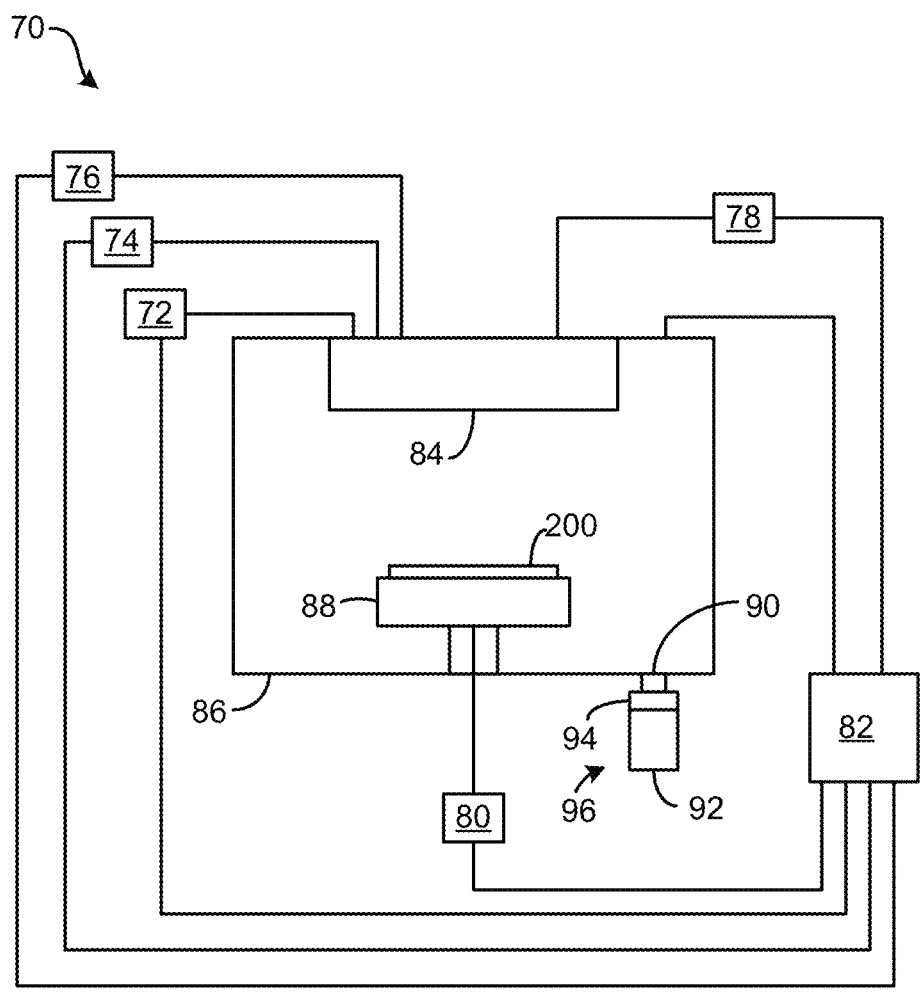
FIG. 7 is a schematic view of an Atomic Layer Deposition (ALD) system for use with one or more embodiments of the present invention.

According to one embodiment, the metal-containing catalyst layer 247 may be deposited by an ALD deposition process in an ALD system 70, one example of which is shown in FIG. 7, which includes a process chamber 86 having a substrate holder 88 configured to support the substrate 200 thereon. The process chamber 86 further contains an upper assembly 84 (for example, a shower head) coupled to a first process material supply system 72, a second process material supply system 74, a purge gas supply system 76, and one or more auxiliary gas supply systems 78 (which may include an oxygen-containing gas, a nitrogen-containing gas, or other as necessary for depositing the desired metal-containing catalyst layer material), and a substrate temperature control system 80.

Alternatively, or in addition, a controller 82 may be coupled to one or more additional controllers/computers (not shown), which may obtain setup and/or configuration information from the additional controllers/computers. The controller 82 may be used to configure any number of the processing elements 72, 74, 76, 78, 80, and may collect, provide, process, store, and/or display data from the same. The controller 82 may comprise a number of applications for controlling one or more of the processing elements 72, 74, 76, 78, 80, and may, if desired, include a graphical user interface ("GUI," not shown) that may provide an easy to use interface for a user to monitor and/or control one or more of the processing elements 72, 74, 76, 78, 80.

The process chamber 86 is further coupled to a pressure control system 96, including a vacuum pumping system 92 and a valve 94, through a duct 90, wherein the pressure control system 96 is configured to controllably evacuate the process chamber 86 to a pressure suitable for forming the metal-containing catalyst layer 247 and suitable for use of the first and second process materials. The pressure control system 96 may include a turbo-molecular vacuum pump or a cryogenic pump that is capable of a pumping speed up to about 5000 liters per second (and greater) and the valve 94 may include a gate valve for throttling the chamber pressure. Moreover, a device (not shown) for monitoring the chamber process may be coupled to the process chamber 86. The pressure control system 96 may, for example, be configured to control the process chamber pressure between about 0.1 Torr and about 100 Torr during an ALD process.

The first and second material supply systems 72, 74, the purge gas supply system 76, and each of the one or more auxiliary gas supply systems 78 may include one or more pressure control devices, one or more flow control devices, one or more filters, one or more valves, and/or one or more flow sensors. The flow control devices may include pneumatic driven valves, electro-mechanical (solenoidal) valves, and/or high-rate pulsed gas injection valves. According to embodiments of the invention, gases may be sequentially and alternately pulsed into the process chamber 86, where the length of each gas pulse may, for example, be between about 0.1 second and about 100 seconds. Alternately, the length of each gas pulse may be between about 1 second and about 10 seconds. Exemplary gas pulse lengths for oxygen- and nitrogen-containing gases may be between about 0.3 second and about 3 seconds, for example, about 1 second. Exemplary purge gas pulses may be between about 1 second and about 20 seconds, for example, about 3 seconds. An exemplary pulsed gas injection system is described in greater detail in U.S. Application Publication No. 2004/0123803.

Still referring to FIG. 7, the controller 82 may comprise a microprocessor, memory, and a digital I/O port capable of generating control voltages sufficient to communicate and activate inputs to the ALD system 70, as well as monitor outputs from the ALD system 70. Moreover, the controller 82 may be coupled to and may exchange information with the process chamber 86, the substrate holder 88, the upper assembly 84, the processing elements 72, 74, 76, 78, the substrate temperature control system 80, and the pressure control system 96. For example, a program stored in a memory of the controller 82 may be utilized to activate the inputs to the aforementioned components of the ALD system 70 according to a process recipe in order to perform a deposition process. One example of the controller 82 is a DELL PRECISION WORKSTATION 610™, commercially-available from Dell Corp., (Austin, Tex.).

However, the controller 82 may be implemented as a general purpose computer system that performs a portion or all of the microprocessor-based processing steps of the present invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 82 includes at least one computer readable medium or memory, such as the controller memory, for holding instructions programmed according to the teachings of the invention and for containing data structures, tables, records, or other data that may be necessary to implement the present invention. Examples of computer readable media are hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 82, for driving a device or devices for implementing the present invention, and/or for enabling the controller 82 to interact with a human user. Such software may include, but is not limited to, device drivers, operating systems, development tools, and applications software. Such computer readable media further includes the computer program product of the present invention for performing all or a portion (if processing is distributed) of the processing performed in implementing the present invention.

The computer code devices may be any interpretable or executable code mechanism, including but not limited to scripts, interpretable programs, dynamic link libraries ("DLLs"), Java classes, and complete executable programs. Moreover, parts of the processing of the present invention may be distributed for better performance, reliability, and/or cost.

The term "computer readable medium" as used herein refers to any medium that participates in providing instructions to the processor of the controller 82 for execution. Thus, computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller 82 for execution. For example, the instructions may initially be carried on a magnetic disk of a remote computer. The remote computer can load the instructions for implementing all or a portion of the present invention remotely into a dynamic memory and send the instructions over a network to the controller 82.

The controller 82 may be locally located relative to the ALD system 70, or it may be remotely located relative to the ALD system 70. For example, the controller 82 may exchange data with the ALD system 70 using at least one of a direct connection, an intranet, the Internet and a wireless connection. The controller 82 may be coupled to an intranet at, for example, a customer site (i.e., a device maker, etc.), or it may be coupled to an intranet at, for example, a vendor site (i.e., an equipment manufacturer). Additionally, for example, the controller 82 may be coupled to the Internet. Furthermore, another computer (i.e., controller, server, etc.) may access, for example, the controller 82 to exchange data via at least one of a direct connection, an intranet, and the Internet. As also would be appreciated by those skilled in the art, the controller 82 may exchange data with the ALD system 70 via a wireless connection.

Conformally coating surfaces of the substrate 200 with a metal-containing catalyst layer 247 may proceed by sequential and alternating pulse sequences to deposit the different components (here, for example, a metal and oxygen) of the metal-containing catalyst layer 247. Since ALD processes typically deposit less than a monolayer of the component per gas pulse, it is possible to form a homogenous material using separate deposition sequences of the different components of the film. Each gas pulse may include a respective purge or evacuation step to remove unreacted gas or byproducts from the process chamber 86. According to other embodiments of the present invention, one or more of the purge or evacuation steps may be omitted.

Therefore, and as one exemplary embodiment, the substrate 200 is disposed in the process chamber 86 of the ALD system 70 and sequentially exposed to a gas pulse containing a metal and a gas pulse of an oxygen-containing gas, the latter of which may include $O_2$, $H_2O$, $H_2O_2$, ozone, plasma-exited oxygen (such as for use in PEALD systems), or a combination thereof, and optionally an inert gas, such as argon (Ar). The metal may react on the surface of the substrate 200 to form a chemisorbed layer that is less than a monolayer thick. The oxygen from the gas pulse of the oxygen-containing gas may then react with the chemisorbed surface layer. By repeating this sequential gas exposure, i.e., by alternating the two exposures a plurality of times, it is possible to achieve layer-by-layer growth of about 1 angstrom per cycle until a desired thickness is achieved.

According to one embodiment, conformally coating surfaces of the substrate 200 with a metal-containing catalyst layer 247 may proceed by exposing the substrate 200 to a gas pulse containing a metal to adsorb a metal-containing catalyst layer 247 on surfaces of the substrate 200. The metal may react on the surface of the substrate 200 to form a chemisorbed layer that is less than a monolayer thick. In one example, the metal-containing catalyst layer 247 may include a metal-containing precursor, e.g., trimethylaluminum ($AlMe_3$). Each gas pulse may include a respective purge or evacuation step to remove unreacted gas or byproducts from the process chamber 86.

The method further includes, in 16, in the absence of any oxidizing and hydrolyzing agent, exposing the substrate 200 at a substrate temperature of approximately 150° C. or less, to a process gas containing a silanol gas to deposit a conformal $SiO_2$ film 248 in the recessed features 230 and 240. The thickness of the conformal $SiO_2$ film 248 is controlled by self-limiting adsorption of the silanol gas on the metal-containing catalyst layer 247. According to embodiments of the invention, the metal-containing catalyst layer 247 catalyzes deposition of a conformal $SiO_2$ film 248 on the substrate 200, including in the recessed features 230 and 240. This catalytic effect was observed until the $SiO_2$ films were about 3 nm thick, thereafter the $SiO_2$ deposition stopped. In some examples, the silanol gas may be selected from the group consisting of tris(tert-pentoxy) silanol (TPSOL), tris(tert-butoxy) silanol, and bis(tert-butoxy)(isopropoxy) silanol.

The method further includes, in 18, determining if the recessed features 230 and 240 are filled with void-free and seamless $SiO_2$ material. If YES, then the substrate 200 may be further processed to form a microelectronic device. If NO, then steps 14 and 16 may be repeated at least once until the recessed features have been filled with void-free and seamless $SiO_2$.

According to embodiments of the invention, substrate 200 is exposed to the process gas containing a silanol gas in the absence of any oxidizing and hydrolyzing agent. The inventors have discovered that oxidizing and hydrolyzing agents are not required for the void-free and seamless $SiO_2$ filling. In some examples, the process gas may further contain an inert gas such as Argon. In one embodiment, the process gas may consist of a silanol gas and an inert gas. Furthermore, according to one embodiment, the substrate temperature may be approximately 150° C. or less, during the exposing. In another embodiment, the substrate temperature may be approximately 120° C. or less. In yet another embodiment, the substrate temperature may be approximately 100° C. or less.

According to one embodiment of the invention, the coating step 14 and the exposing step 16 are performed a plurality of times, the first time the sidewalls of the recessed features 230 and 240 are coated with $Al_2O_3$, and thereafter the sidewalls are coated with AlMe3 each time the coating is repeated.

According to another embodiment of the invention, the coating step 14 and the exposing step 16 are performed a plurality of times, the first time the sidewalls are coated with $HfO_2$, and $Al_2O_3$ on the $HfO_2$, and thereafter the surfaces are coated with $AlMe_3$ each time the coating is repeated.

Figure 3:
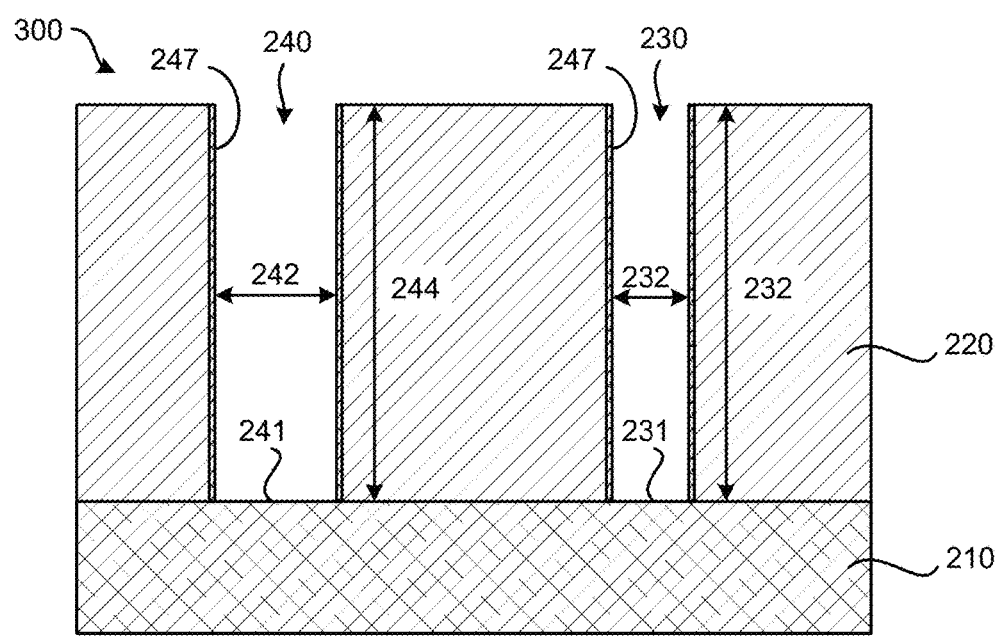
FIG. 3 schematically shows through a cross-sectional view another substrate that may be processed according to an embodiment of the invention.

FIG. 3 schematically shows through a cross-sectional view another substrate that may be processed according to embodiments of the invention. The substrate 300 in FIG. 3 is similar to the substrate 200 in FIG. 2B, but an anisotropic dry etching step has been performed to remove horizontal portions of the metal-containing catalyst layer 247 prior to depositing a conformal $SiO_2$ film on the substrate 300. The anisotropic dry etching step may include dry plasma etching processes. For example, fluorocarbon chemistry or halogen-containing chemistry may be used to etch the. Additionally, for example, a $C_xF_y$-based process chemistry, or a $C_xF_yH_z$-based process chemistry, or both may be used. Additionally yet, for example, $CH_2F_2$ and $CHF_3$ may be used to etch the remaining sacrificial film material. Further, a $SF_6$-based chemistry may be used to etch the horizontal portions of the metal-containing catalyst layer 247.

Referring to FIG. 1 and FIG. 3, in 18, if the recessed features 230 and 240 are not filled with void-free and seamless $SiO_2$ material, then steps 14 and 16 may be repeated at least once until the recessed features 230, 240 have been filled with void-free and seamless $SiO_2$ film 248.

$SiO_2$ deposition experiments were performed using tris (tert-pentoxy) silanol (TPSOL). Exemplary deposition conditions included substrate temperature of 150° C., silanol pulse durations of 60 seconds, purge gas pulse durations of 30 seconds, process chamber pressure of about 1 Torr. The resulting $SiO_2$ films were of good quality with a refractive index close to that of thermal oxide, fused silica, and TEOS CVD. Selective $SiO_2$ deposition was observed on $Al_2O_3$ layers and substrates with adsorbed $AlMe_3$ precursors. It is contemplated that the adsorbed $AlMe_3$ precursors may be present as $AlMe_x$ on the substrate, where x<3. This demonstrates the catalytic effect of aluminum on $SiO_2$ deposition using a silanol precursor. This catalytic effect was observed until the $SiO_2$ films were about 3 nm thick, thereafter the $SiO_2$ deposition stopped. Additional $SiO_2$ film deposition of about 3 nm using silanol exposure could be achieved by first depositing a thin $Al_2O_3$ layer or absorbing a AlMe3 precursor on the deposited $SiO_2$ film. These alternating steps could be repeated as needed to deposit a thick $SiO_2$ film and fill fine recessed features with void-free and seamless SiO2.

Figure 4:
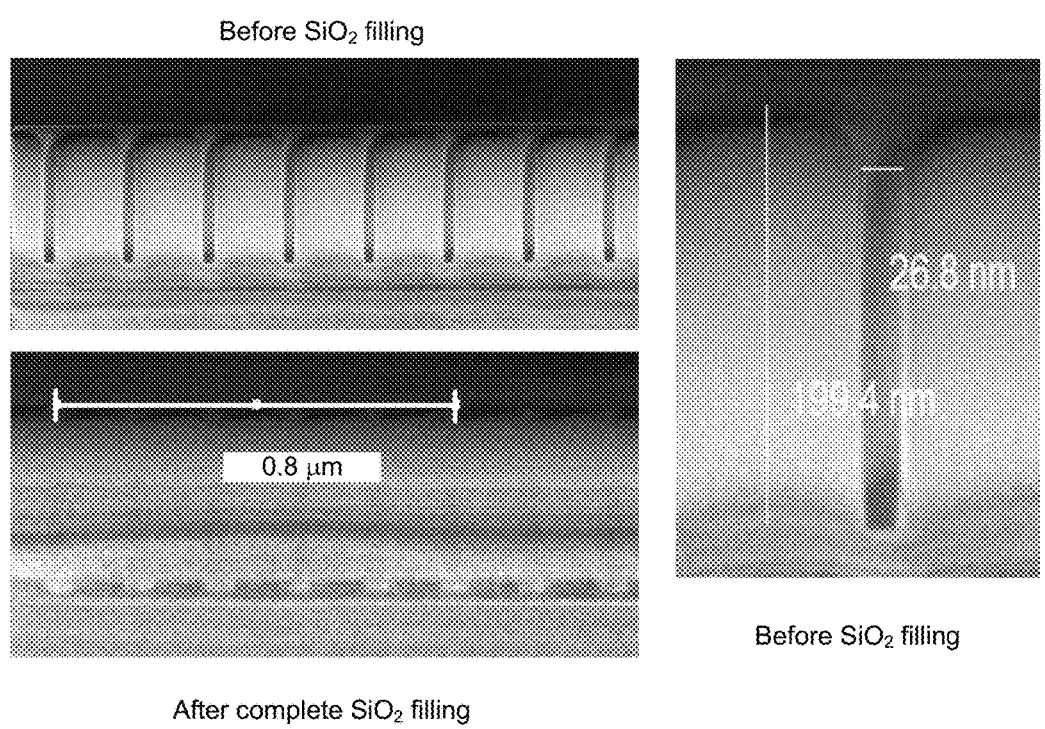
FIGS. 4-6 show cross-sectional views of $SiO_2$ filling of recessed features having aspect ratios between 7 and 10 according to embodiments of the invention.
Figure 5:
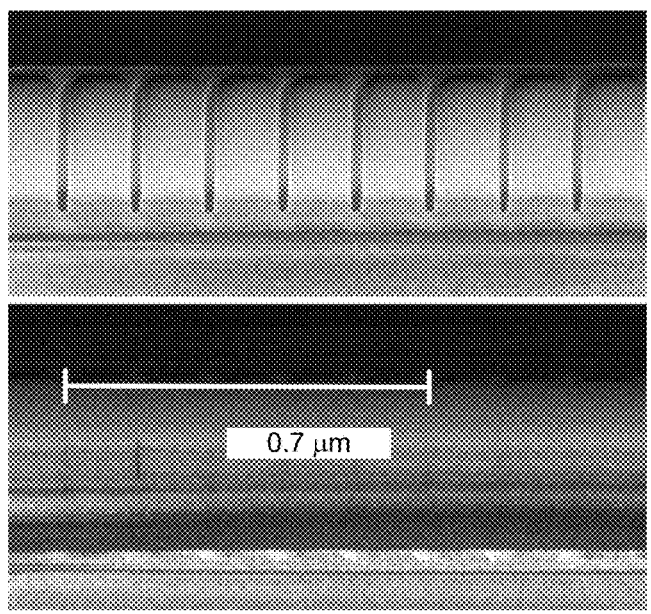
Figure 5:
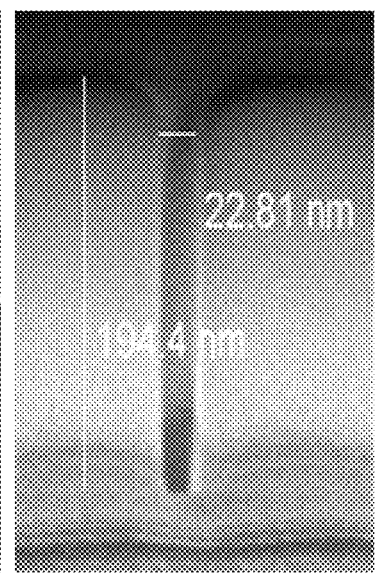
Figure 6:
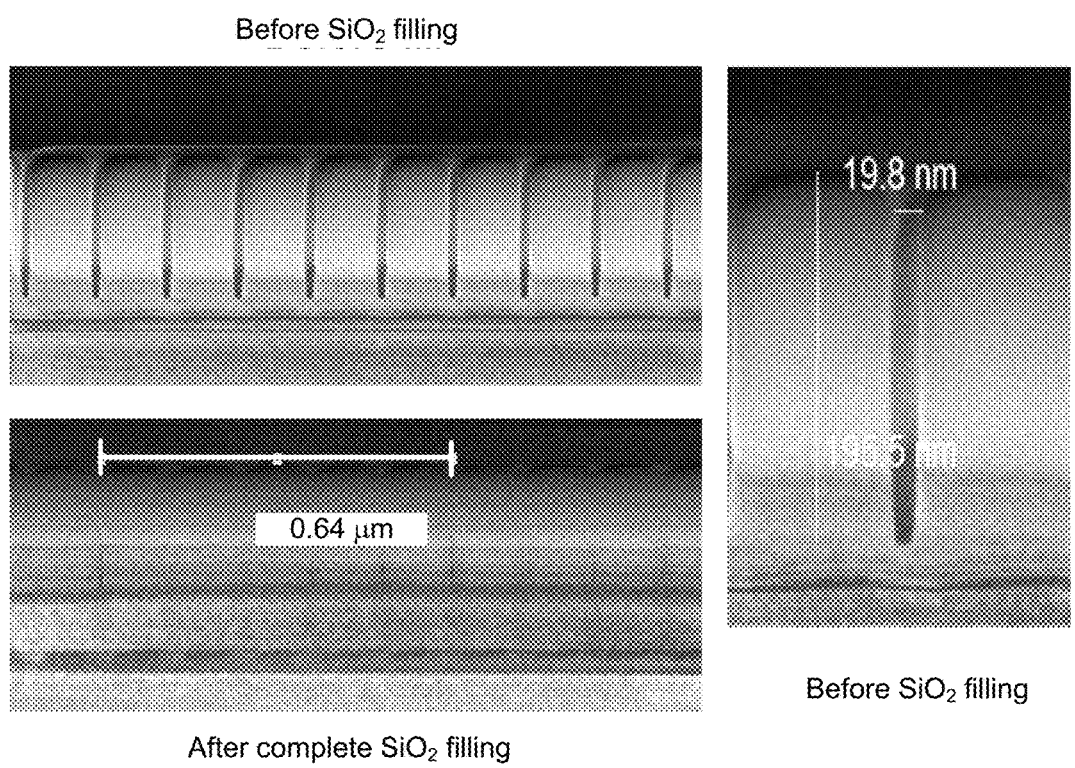

FIGS. 4-6 show cross-sectional views of complete $SiO_2$ filling of recessed features having aspect ratios between about 7 and about 10 according to embodiments of the invention. The $SiO_2$ filling was performed using alternating exposures of $AlMe_3$ and tris(tert-pentoxy) silanol as described above. Void-free and seamless $SiO_2$ filling of recessed features with aspect ratios as great as 10 was observed.

FIG. 4 shows complete $SiO_2$ filing of recessed features having AR of about 7 (width of about 26.8 nm and a depth of about 199.4 nm).

FIG. 5 shows complete $SiO_2$ filing of recessed features having AR of about 8 (width of about 22.8 nm and a depth of about 194.4 nm).

FIG. 6 shows complete $SiO_2$ filing of recessed features having AR of about 10 (width of about 19.8 nm and a depth of about 195.5 nm).

According to one embodiment of the invention, the SiO2 films deposited to fill a recessed feature using a silanol gas (e.g., TPSOL) may be used for STI applications. STIs are integrated circuit features which prevent current leakage between adjacent semiconductor device components. STIs are created early during the semiconductor device fabrication process, before transistors are formed. The key steps of forming STIs involve etching a pattern of trenches in the silicon, depositing one or more dielectric materials (e.g., $SiO_2$) to fill the trenches, and removing the excess dielectric using a technique such as chemical-mechanical planarization (CMP).

Material and processing requirements for $SiO_2$ films used in STIs for advanced integrated circuits include good filling properties (i.e., complete filling with no voids), low temperature deposition and annealing due to thermal budget restraints, and etch properties similar to conventional thermal oxide. Several methods have been developed in an attempt to address these requirements. In one example, flowable CVD (FCVD) processes have been developed to achieve adequate fill for STIs in FinFET structures. However, FCVD requires curing at a temperature of about 1000° C. in steam and an $N_2$ anneal to densify and form a good quality oxide with good etch properties. However, such high temperature is not acceptable for many manufacturing processes. Alternatively, FCVD $SiO_2$ may be improved using a combination of UV curing and steam anneal at a temperature of about 500° C. for 1-2 hours.

As device feature sizes are scaled down, new channel materials such as Ge and SiGe have been introduced into advanced integrated circuits. For example, high-mobility channel materials such as SiGe are important to achieve performance targets for FinFET devices at dimensions scaled beyond 14 nm. The use of SiGe in FinFETs limits the thermal budget (i.e., annealing temperature and time) in order to avoid out-diffusion of Ge. This restricts the processing options for achieving a robust STI material with is compatible with subsequent wet processing steps.

Figure 8:
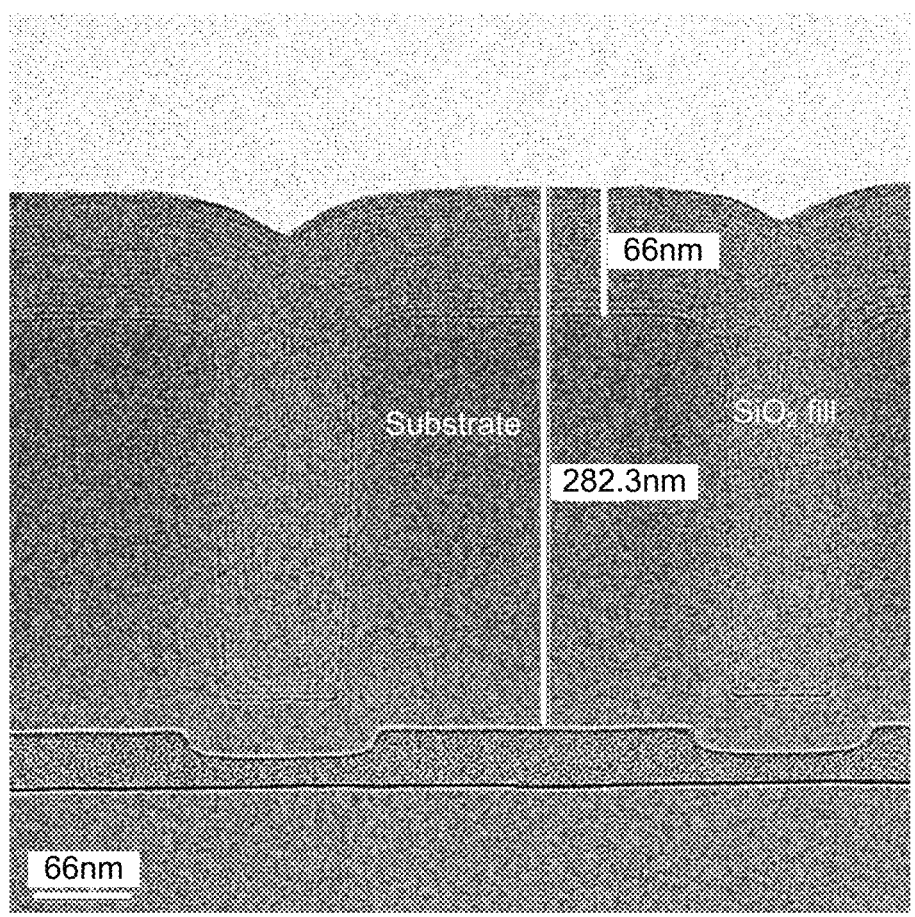
FIG. 8 shows a cross-sectional view of $SiO_2$ filling of recessed features that can form STI structures according to an embodiment of the invention.

FIG. 8 shows a cross-sectional view of $SiO_2$ filling of recessed features that can form STI structures according to an embodiment of the invention. The $SiO_2$ was deposited at 150° C. using alternating exposures of AlMe3 and TPSOL. The figure shows excellent $SiO_2$ filling with no visible voids or seams. The $SiO_2$ filling was performed for recessed features with different aspect ratios.

Figure 9:
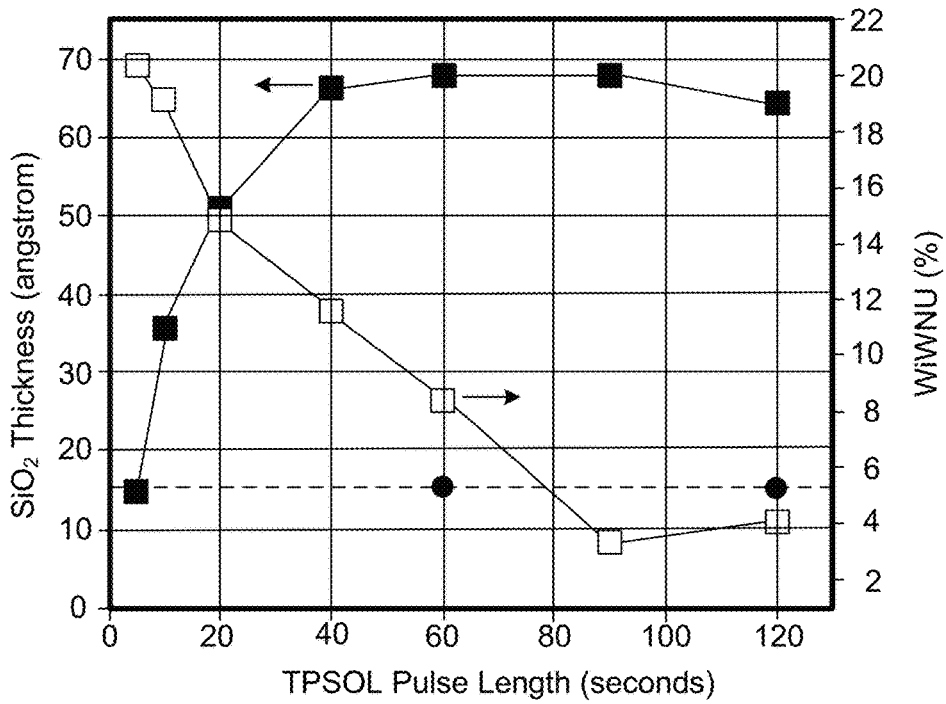
FIG. 9 shows $SiO_2$ film thickness and Within-Wafer-Nonuniformity (WiWNU) as a function of TPSOL pulse length according to an embodiment of the invention.

FIG. 9 shows $SiO_2$ film thickness and Within-Wafer-Nonuniformity (WiWNU) as a function of TPSOL pulse length according to an embodiment of the invention. The $SiO_2$ films were deposited on a 15 Å thick chemical oxide layer at a substrate temperature of 150° C. using sequential exposures of $AlMe_3$ and TPSOL with varying TPSOL pulse durations. The figure shows that the $SiO_2$ thickness was self-limiting for TPSOL pulse duration of about 60 seconds following the $AlMe_3$ exposure. The figure further shows (solid circles) that no $SiO_2$ deposition was observed on the chemical oxide layer after TPSOL pulse durations of 60 sec and 120 sec when an $AlMe_3$ exposure was omitted.

Figure 10:
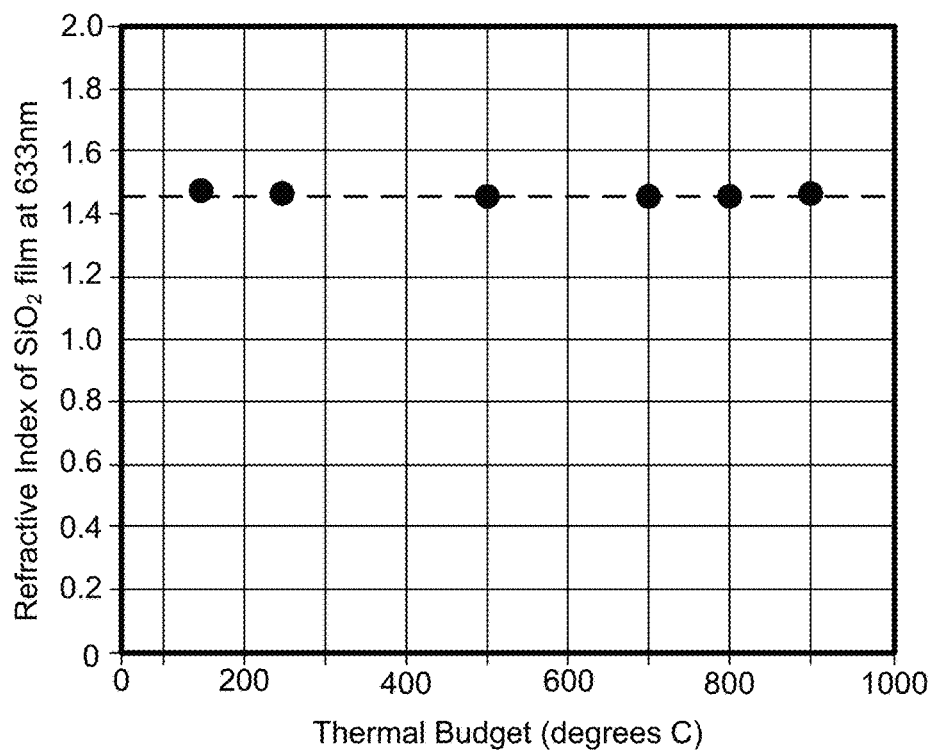
FIG. 10 shows the refractive index of $SiO_2$ films at 633 nm versus thermal budget.

FIG. 10 shows the refractive index of $SiO_2$ films at 633 nm versus thermal budget according to an embodiment of the invention. The $SiO_2$ films were deposited at 150° C. and thereafter annealed at the indicated temperatures. The results show that the refractive index was between 1.4 and 1.5 for all the $SiO_2$ films. This compares well to a refractive index of about 1.457 for thermal oxide films.

Figure 11:
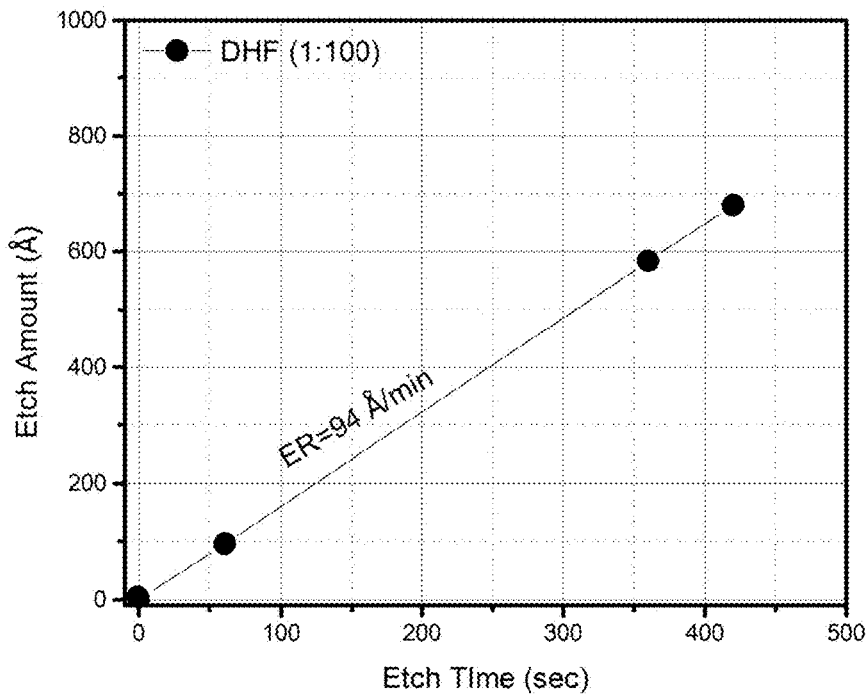
FIG. 11 shows etch amount of $SiO_2$ films in dilute HF (DHF) (1:100) as a function of etch time.

FIG. 11 shows etch amount of $SiO_2$ films in DHF (1:100) as a function of etch time. The $SiO_2$ films had a thickness of 150 nm and were deposited at 150° C. using alternating exposures of $AlMe_3$ and TPSOL on a chemical oxide layer. The figure shows a linear etch rate of 94 Å/min.

Figure 12:
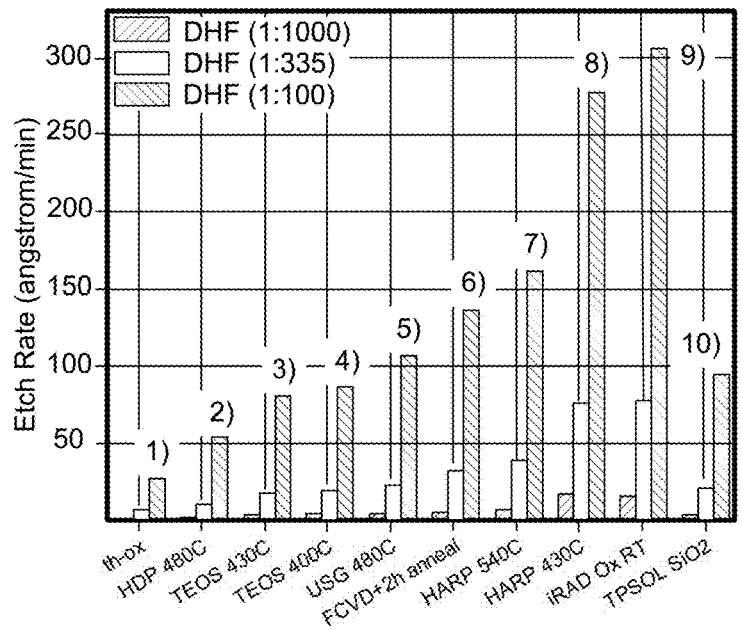
FIG. 12 shows etch rate of different $SiO_2$ films in DHF.

FIG. 12 shows etch rate of different $SiO_2$ films in DHF. The etching solutions used were DHF (1:100), DHF (1:335), and DHF (1:1000). The $SiO_2$ films included: 1) thermal oxide; 2) $SiO_2$ deposited using high density plasma (HDP) at 480° C.; 3) $SiO_2$ deposited using a plasma process with TEOS at 430° C.; 4) $SiO_2$ deposited using a plasma process with TEOS at 400° C.; 5) undoped silica glass (USG) formed at 480° C.; 6) $SiO_2$ deposited using FCVD and annealed for 2 hours at 1050° C.; 7) HARP™ oxide film annealed at 540° C., 8) HARP™ oxide film annealed at 430° C., 9) $SiO_2$ deposited using ALD with alternating silicon precursor and plasma $O_2$ exposures at room temperature, and 10) $SiO_2$ deposited at 150° C. using alternating exposures of $AlMe_3$ and TPSOL. For next generation semiconductor devices, it is preferred that $SiO_2$ be deposited at low substrate temperatures and have similar etch rates as thermal oxide films. The results in FIG. 12 show that $SiO_2$ deposited using $AlMe_3$ and TPSOL at 150° C. meets those two requirements better than the other $SiO_2$ films.

Figure 13:
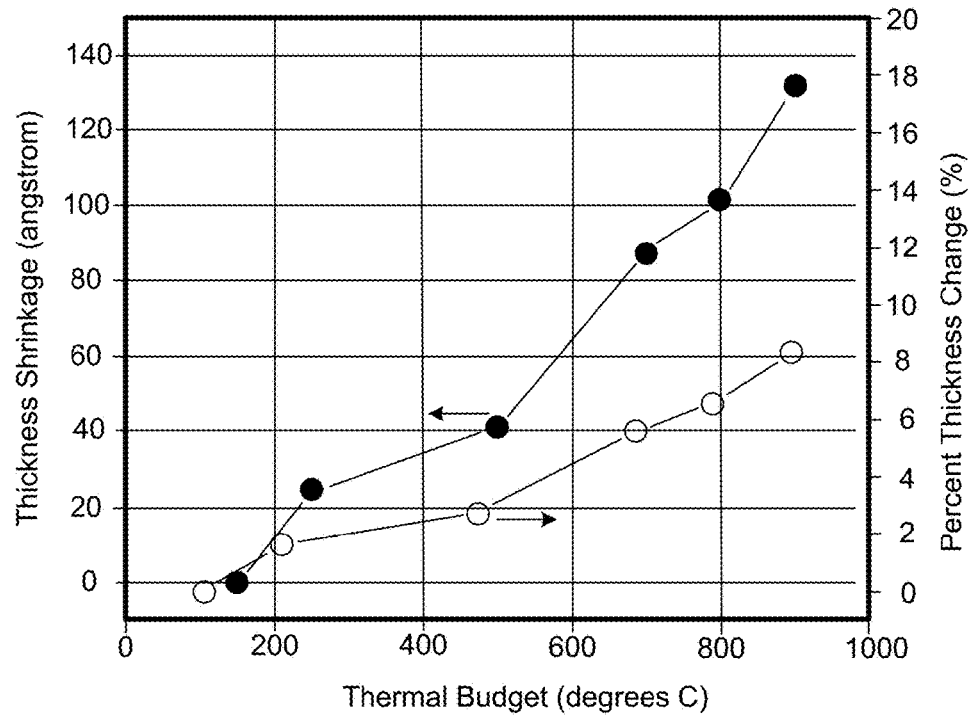
FIG. 13 shows $SiO_2$ thickness shrinkage and percent thickness change as a function of thermal budget.

FIG. 13 shows $SiO_2$ thickness shrinkage and percent thickness change as a function of thermal budget. The $SiO_2$ films had a thickness of 150 nm on a chemical oxide layer and were deposited at 150° C. using alternating exposures of AlMe3 and TPSOL. The figure shows less than 3% change in film thickness after a post-deposition anneal at 500° C. in $N_2$. This may be compared to 20-50% shrinkage of FCVD films after a post-deposition steam anneal.

Figure 14:
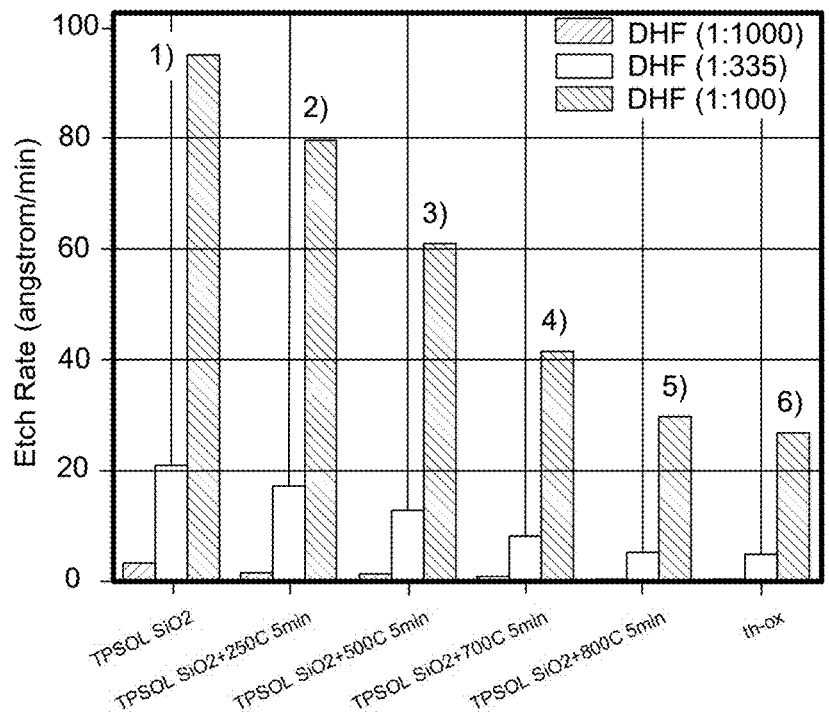
FIG. 14 shows etch rate of different $SiO_2$ films in DHF as a function of annealing temperature.

FIG. 14 shows etch rate of $SiO_2$ films in DHF as a function of annealing temperature. The $SiO_2$ films were deposited at 150° C. on a thermal oxide layer using alternating exposures of $AlMe_3$ and TPSOL. Some of the as-deposited $SiO_2$ films were further annealed for 5 min in $N_2$ before etching in DHF: 1) no anneal; 2) anneal at 250° C.; 3) anneal at 500° C.; 4) anneal at 700° C.; and 5) anneal at 800° C. The figure shows that the anneals improved the $SiO_2$ films to further match the etch rate of 6) a thermal oxide.

Figure 15:
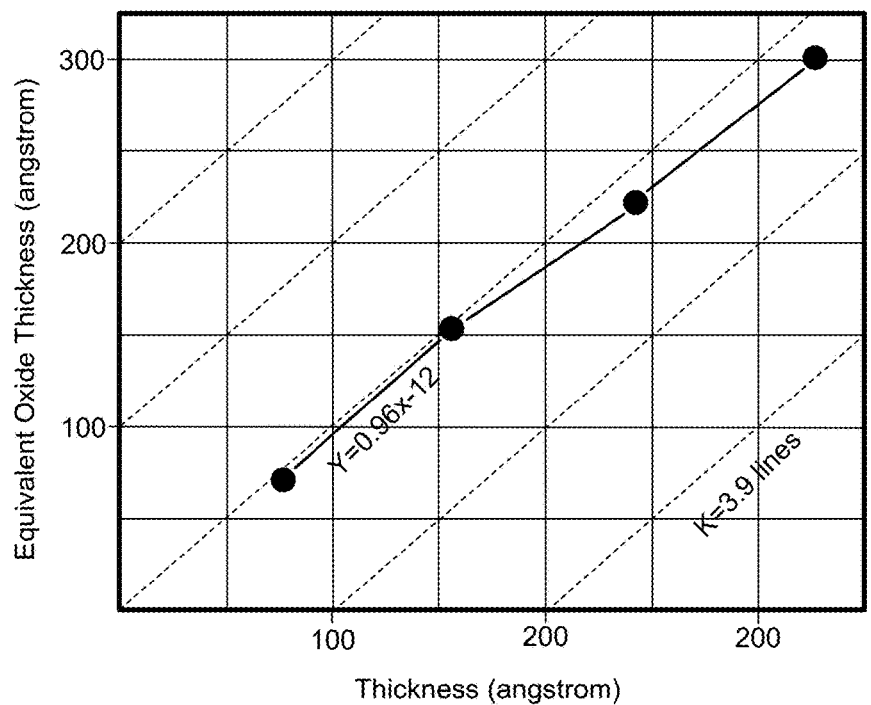
FIG. 15 shows equivalent oxide thickness (EOT) versus physical thickness for $SiO_2$ films.

FIG. 15 shows equivalent oxide thickness (EOT) versus physical thickness for $SiO_2$ films. The $SiO_2$ films were deposited at 150° C. using alternating exposures of $AlMe_3$ and TPSOL, and thereafter processed at 400° C. A dielectric constant (k) of 4.06 was calculated from the data in the figure. This value agrees very well with the k value of 3.9 for a thermal oxide layer.

Figure 16A:
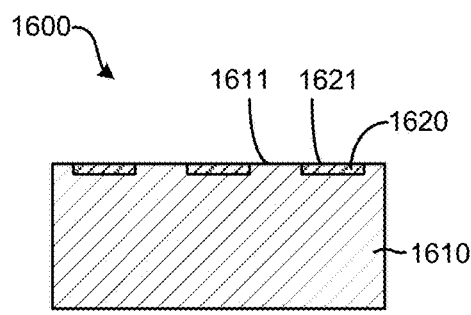
FIGS. 16A and 16B schematically show through cross-sectional views a method of processing a substrate according to an embodiment of the invention.
Figure 16B:
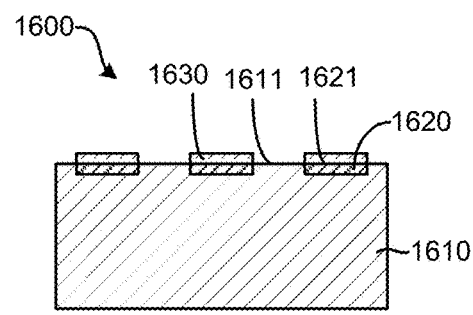

FIGS. 16A and 16B schematically show through cross-sectional views a method of processing a substrate according to an embodiment of the invention. The substrate 1600 contains a first material 1610 having a first surface 1611 and a second material 1620 having a second surface 1621, where the first material 1610 is different from the second material 1620. In the non-limiting example shown in FIG. 16A, the second material 1620 is inlaid in the first material 1610. In some examples the first material 1610 may be selected from the group consisting of silicon, germanium, silicon germanium, a dielectric material, a metal, and a metal-containing material. The dielectric material may selected from the group consisting of $SiO_2$, SiON, SiN, a high-k material, a low-k material, and an ultra-low-k material. In one example, the high-k material may be selected from $HfO_2$ and $ZrO_2$. For example, the second material 1620 can include a metal-containing catalyst layer that is selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, and combinations thereof.

The method includes exposing the substrate 1600 to a process gas containing a silanol gas to selectively deposit a $SiO_2$ film 1630 on the second surface 1621 of the second material 1620, but not on the first surface 1611 of the first material 1610. According to embodiments of the invention, the metal-containing catalyst layer catalyzes selective deposition of the $SiO_2$ film 1630 on the second surface 1621. This catalytic effect may be observed until the $SiO_2$ film 1630 reaches a thickness where the silanol gas is no longer able to interact with the metal-containing catalyst layer. Thereafter, the $SiO_2$ film deposition stops. In one example, this thickness can be about 3 nm thick.

According to embodiments of the invention, substrate 1600 is exposed to the process gas containing a silanol gas in the absence of any oxidizing and hydrolyzing agent. In some examples, the process gas may further contain an inert gas such as Argon. In one embodiment, the process gas may consist of a silanol gas and an inert gas. Furthermore, according to one embodiment, the substrate temperature may be approximately 150° C. or less, during the exposing. In another embodiment, the substrate temperature may be approximately 120° C. or less. In yet another embodiment, the substrate temperature may be approximately 100° C. or less. According to some embodiments, a process chamber pressure between about 0.1 Torr and about 100 Torr may be used during silanol gas exposure. Some process chamber pressure examples include between 0.1 Torr and 10 Torr, between 0.5 Torr and 10 Torr, between 0.5 Torr and 5 Torr, below about 10 Torr, below about 5 Torr, and below about 2 Torr.

The method described in FIGS. 16A and 16B provides selective $SiO_2$ deposition on a growth surface (second surface 1621), and not on a non-growth surface (first surface 1611). In one example the $SiO_2$ film may be used as a capping layer that protects the second surface 1621 during further substrate processing. In one example, the capping layer may be removed from the substrate 1600 when protection of the second surface 1621 is no longer needed. In another example, the capping layer may become a permanent part of the microelectronic device.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A substrate processing method, the method comprising:
providing a substrate containing recessed features;
coating surfaces of the recessed features with a metal-containing catalyst layer;
in the absence of any oxidizing and hydrolyzing agent, exposing the substrate at a substrate temperature of approximately 150° C. or less, to a process gas containing a silanol gas to deposit a conformal $SiO_2$ film in the recessed features; and
repeating the coating and exposing at least once to increase the thickness of the conformal $SiO_2$ film until the recessed features are filled with $SiO_2$ material that is void-free and seamless in the recessed features, wherein the coating and exposing are performed a plurality of times, the first time the sidewalls of the recessed features are coated with $Al_2O_3$ and thereafter the sidewalls are coated with trimethylaluminum ($AlMe_3$) each time the coating is repeated.

2. The method of claim 1, wherein the silanol gas is selected from the group consisting of tris(tert-pentoxy) silanol, tris(tert-butoxy) silanol, and bis(tert-butoxy)(isopropoxy) silanol.

3. The method of claim 1, wherein the metal-containing catalyst layer contains aluminum, titanium, or a combination thereof.

4. The method of claim 3, wherein the metal-containing catalyst layer is selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, and combinations thereof.

5. The method of claim 1, wherein the coating includes exposing the substrate to trimethylaluminum ($AlMe_3$) gas.

6. The method of claim 1, wherein the substrate temperature is approximately 100° C. or less, during the exposing.

7. The method of claim 1, wherein the process gas consists of a silanol gas and an inert gas.

8. The method of claim 1, wherein the recessed features filled with $SiO_2$ material form shallow trench isolation (STI) structures in a semiconductor device.

9. The method of claim 1, further comprising
removing excess $SiO_2$ from above the recessed feature in a planarizing process.

10. The method of claim 9, wherein the removing is performed using chemical-mechanical planarization (CMP).

11. A substrate processing method, the method comprising:
providing a substrate containing recessed features;
coating surfaces of the recessed features with a metal-containing catalyst layer;
in the absence of any oxidizing and hydrolyzing agent, exposing the substrate at a substrate temperature of approximately 150° C. or less, to a process gas containing a silanol gas to deposit a conformal $SiO_2$ film in the recessed features; and
repeating the coating and exposing at least once to increase the thickness of the conformal $SiO_2$ film until the recessed features are filled with $SiO_2$ material that is void-free and seamless in the recessed features, wherein the coating and exposing are performed a plurality of times, the first time the sidewalls are coated with $HfO_2$, and $Al_2O_3$ on the $HfO_2$, and thereafter the sidewalls are coated with trimethylaluminum ($AlMe_3$) each time the coating is repeated.

12. A substrate processing method, the method comprising:
  providing a substrate containing a first material containing a first surface and a second material containing a second surface, where the second surface contains a metal-containing catalyst layer; and
  in the absence of any oxidizing and hydrolyzing agent, exposing the substrate at a substrate temperature of approximately 150° C. or less, to a process gas containing a silanol gas to selectively deposit a $SiO_2$ film on the second surface, but not on the first surface.

13. The method of claim 12, wherein the silanol gas is selected from the group consisting of tris(tert-pentoxy) silanol, tris(tert-butoxy) silanol, and bis(tert-butoxy)(isopropoxy) silanol.

14. The method of claim 12, wherein the metal-containing catalyst layer contains aluminum, titanium, or a combination thereof.

15. The method of claim 12, wherein the metal-containing catalyst layer is selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, and combinations thereof.

16. The method of claim 12, wherein the first material is selected from the group consisting of silicon, germanium, silicon germanium, a dielectric material, a metal, and a metal-containing material.

17. The method of claim 16, wherein the dielectric material is selected from the group consisting of $SiO_2$, SiON, SiN, a high-k material, a low-k material, and an ultra-low-k material.

18. The method of claim 12, wherein the substrate temperature is approximately 100° C. or less, during the exposing.

19. The method of claim 12, wherein the process gas consists of a silanol gas and an inert gas.

20. The method of claim 12, wherein the first surface does not contain the metal-containing catalyst layer.

* * * * *